(12) United States Patent
Weber et al.

(10) Patent No.: US 9,263,526 B2
(45) Date of Patent: *Feb. 16, 2016

(54) SEMICONDUCTOR COMPONENT

(75) Inventors: Heiko B. Weber, Erlangen (DE);
Michael Krieger, Röthenbach (DE);
Stefan Hertel, Roth (DE); Florian Krach, Veitsbronn (DE); Johannes Jobst, Fürth (DE); Daniel Waldmann, Lambsheim (DE)

(73) Assignee: Friedrich-Alexander-Universität Erlangen-Nürnberg, Erlangen (DE)

( * ) Notice: Subject to any disclaimer, the term of this patent is extended or adjusted under 35 U.S.C. 154(b) by 0 days.

This patent is subject to a terminal disclaimer.

(21) Appl. No.: 14/110,952

(22) PCT Filed: Mar. 29, 2012

(86) PCT No.: PCT/EP2012/001383
§ 371 (c)(1),
(2), (4) Date: Jan. 31, 2014

(87) PCT Pub. No.: WO2012/139710
PCT Pub. Date: Oct. 18, 2012

(65) Prior Publication Data
US 2015/0060881 A1    Mar. 5, 2015

(30) Foreign Application Priority Data
Apr. 13, 2011   (DE) .......................... 10 2011 016 900

(51) Int. Cl.
*H01L 29/06* (2006.01)
*H01L 29/16* (2006.01)
(Continued)

(52) U.S. Cl.
CPC .......... *H01L 29/1608* (2013.01); *H01L 29/045* (2013.01); *H01L 29/167* (2013.01); *H01L 29/365* (2013.01); *H01L 29/45* (2013.01); *H01L 29/78* (2013.01)

(58) Field of Classification Search
CPC .............. H01L 29/0673; H01L 29/772; H01L 29/0665; H01L 51/0048
USPC ................................................ 257/24, 27, 29
See application file for complete search history.

(56) References Cited

U.S. PATENT DOCUMENTS 6,956,239 B2    10/2005   Sriram
8,440,999 B2 *   5/2013   Dimitrakopoulos et al. ... 257/24
(Continued)

FOREIGN PATENT DOCUMENTS

CN   101404322 A   4/2009
KR   20100074442 A  7/2010

OTHER PUBLICATIONS

Ristein, J., et al., "Characteristics of Solution Gated Field Effect Transistors on the Basis of Epitaxial Graphene on Silicon Carbide," Journal of Physics D. Applied Physics, IOP Publishing, Bristol, GB, Aug. 12, 2010, vol. 43, No. 34, pp. 1-17.

(Continued)

*Primary Examiner* — Quoc Hoang
(74) *Attorney, Agent, or Firm* — Mendelsohn Dunleavy, P.C.; Steve Mendelsohn

(57) ABSTRACT

A semiconductor component (1, 20, 30) comprising a semiconductor substrate (3) composed of silicon carbide and comprising separate electrodes (4, 5) applied thereto, said electrodes each comprising at least one monolayer of epitaxial graphene (11) on silicon carbide, in such a way that a current channel is formed between the electrodes (4, 5) through the semiconductor substrate (3).

17 Claims, 4 Drawing Sheets

(51) Int. Cl.
  *H01L 29/45* (2006.01)
  *H01L 29/78* (2006.01)
  *H01L 29/04* (2006.01)
  *H01L 29/167* (2006.01)
  *H01L 29/36* (2006.01)

(56) References Cited

U.S. PATENT DOCUMENTS

| 8,673,703 | B2* | 3/2014 | Lin et al. | 438/164 |
|---|---|---|---|---|
| 2009/0020764 | A1 | 1/2009 | Anderson et al. | |
| 2009/0236609 | A1 | 9/2009 | de Heer et al. | |
| 2012/0049160 | A1* | 3/2012 | Sano et al. | 257/27 |
| 2014/0225066 | A1* | 8/2014 | Weber et al. | 257/29 |

OTHER PUBLICATIONS

Krach, F., et al., "A Switch for Expitaxial Graphene Electronics: Utilizing the Silicon Carbide Substrate as Transistor Channel," Applied Physics Letters, Jan. 1, 2012, vol. 100, No. 12, pp. 122102-1 to 122102-3.

Favennec, L., et al. "New low k a-SiC:H dielectric barrier for advanced interconnects," Interconnect Technology Conference, 2006 International. IEEE, 2006, pp. 110-112.

Saraie, J., et al. "Preparation of hydrogenated amorphous Si-C alloy films and their properties," Thin Solid Films 117, (1984), pp. 59-69.

Pensl, G., et al. "SiC Material Properties," International Journal of High Speed Electronics and Systems. vol. 15 No. 4 (2005): pp. 705-745.

* cited by examiner

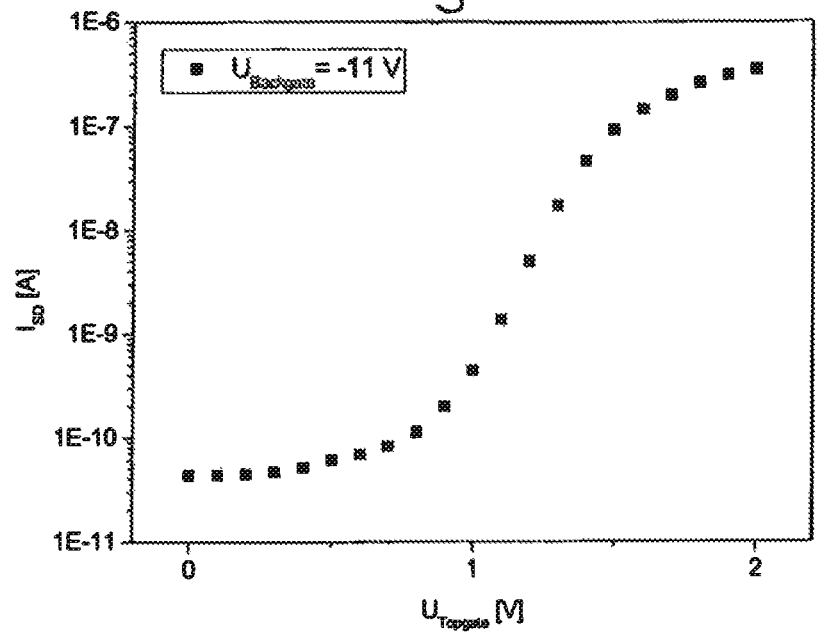
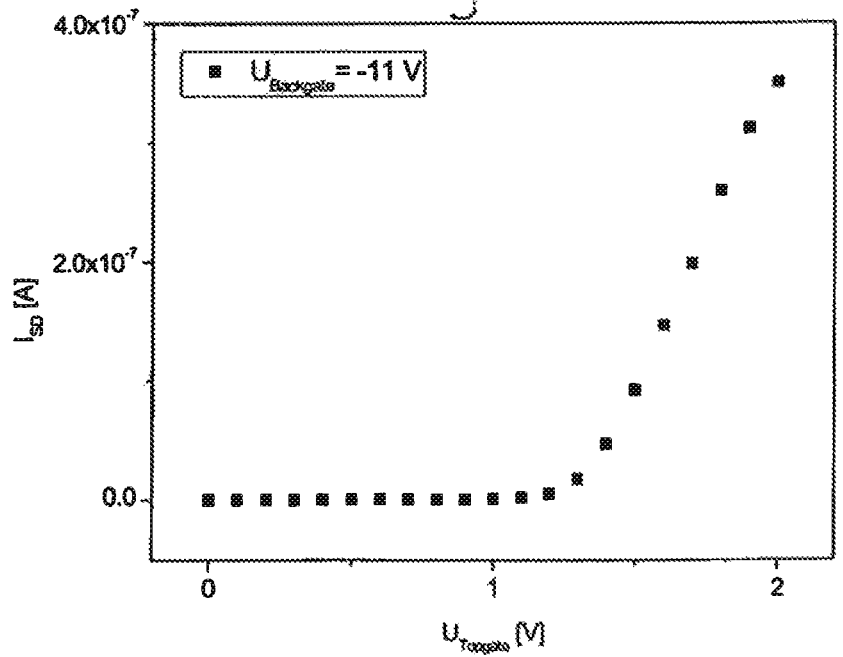

SEMICONDUCTOR COMPONENT

BACKGROUND

1. Field of the Invention

The invention relates to a semiconductor component comprising a semiconductor substrate composed of silicon carbide and comprising separate electrodes applied thereto.

2. Description of the Related Art

Such a semiconductor component based on silicon carbide is known from U.S. Pat. No. 3,254,280, for example. The semiconductor component disclosed therein is constructed as a junction field effect transistor (Junction FET). A source electrode, a gate electrode and a drain electrode are situated on the semiconductor substrate. The current channel between the source and drain electrodes is formed through the semiconductor substrate. Beneath the gate electrode, the silicon carbide exhibits a vertical p-n-p junction as a result of doping. The conductivity of the current channel is controllable by the application of a gate voltage.

Generally, silicon carbide is suitable for switching and for controlling high currents and high voltages on account of the comparatively high band gap of approximately 3 eV. The present-day technical application concepts are based on the principle of a MOSFET, a JFET or a bipolar transistor. The realization of such components necessitates n- and p-conducting regions produced by corresponding doping of the silicon carbide.

SUMMARY

The problem addressed by the invention is that of specifying a novel semiconductor component based on silicon carbide which can be used diversely and is simple to produce.

This problem is solved according to the invention by means of a semiconductor component comprising a semiconductor substrate composed of silicon carbide, wherein separate electrodes are applied on the silicon carbide, said electrodes each comprising at least one monolayer of epitaxial graphene on silicon carbide, such that a current channel is formed between the electrodes through the semiconductor substrate.

Graphene as a monolayer of graphite only became known a few years ago and exhibits extremely good electrical properties such as a very high charge carrier mobility and a very high current-carrying capacity. In a first step, the invention proceeds from the consideration of using the outstanding electrical properties of graphene to construct a novel semiconductor component having improved properties.

Previous considerations concerning the use of graphene for semiconductor components are based here for the most part on the field effect principle. In a graphene monolayer, however, owing to the lack of an energy gap (graphene is not a semiconductor), it is not possible to obtain a high on/off ratio, that is to say the signal swing between switched-on state and switched-off state. With regard to this problem, DE 10 2008 042 323 A1 discloses a graphene component according to the field effect principle, wherein the current channel formed by graphene between a source electrode and a drain electrode is controlled by the application of a gate voltage. The comparatively high signal swing that can be obtained therein is based on a chemical modification of the graphene by the switching operation. On the other hand, in accordance with US 2009/0140801 A1 the current channel is formed by a narrow wire composed of graphene between a source electrode and a drain electrode. The narrow wire results in a quantization of the energy levels allowed for the charge carriers, thereby constraining an energy gap in the graphene.

What is common to all these previous concepts is the use of graphene as such a material for the controllable current channel in order thus to utilize its outstanding electrical properties ideally for the component to be provided.

In a second step, the invention now surprisingly proceeds from the consideration of departing from the path previously taken by those skilled in the art with regard to the use of graphene for electronic components. The previously designed components are complex in terms of their production and can be used only to a limited extent with regard to their current and switching properties. The invention takes the path, rather, of using graphene as electrode material for injecting current, while the controllable current channel is formed through the underlying semiconductor substrate. For this purpose, the electrodes are applied to the semiconductor substrate separately from one another. A material bridge composed of graphene between the electrodes is not present.

The invention furthermore arrives at the step of using graphene as electrode material on silicon carbide through the insight that graphene can be produced comparatively simply by thermal decomposition of silicon carbide surfaces. At temperatures above the sublimation threshold of silicon in silicon carbide (for example in an argon atmosphere at approximately 1700° C.), the silicon sublimates an account of its higher vapor pressure in comparison with carbon. In this case, monolayers of epitaxial graphene form on the surface of the silicon carbide, without the need for complex process control. The production of epitaxial graphene on silicon carbide is known for example from Nature Materials, Konstantin V. Emtsev, "Towards wafer-size Graphene Layers by Atmospheric Pressure Graphitization of Silicon Carbide", Vol. 8, March 2009, pages 203 to 207. By way of example, epitaxial graphene can be produced on the hexagonal (0001) surface of the 6H polytype of silicon carbide. However, other polytypes of silicon carbide and other crystal orientations can likewise be used in order to grow epitaxial graphene on the surface. In particular, multicrystalline silicon carbide is also used. Since extensive defects within the component, such as grain boundaries, in particular, increase leakage currents, it may be recommendable for the grain sizes in multicrystalline silicon carbide not to be chosen to be too small.

In accordance with our own investigations, charge carrier mobilities of 29000 $cm^2$/Vs and charge carrier densities of $1*10^{13}$ $cm^{-2}$ were observed for epitaxial graphene on silicon carbide, these properties being tolerant toward substrate irregularities. A current-carrying capacity of epitaxial graphene of approximately j=4 mA/μm was likewise observed through our own investigations. The layer conductivity can be improved by multilayer graphene up to graphitic layers. Moreover, further investigations that we conducted showed that graphene electrodes on silicon carbide have a low injection barrier.

With knowledge of our own investigations, therefore, a semiconductor component is provided which comprehensively utilizes the physical and electrical properties of an epitaxial interface between silicon carbide and the first graphene layer in an ideal way. While conventional graphene components in which graphene forms a controllable current channel are expensive as a result of stringent material and process requirements, the semiconductor component proposed here with electrodes composed of graphene composed of silicon carbide can be produced comparatively advantageously by a thermal decomposition of the substrate surface as such. The process engineering requirements are significantly reduced by comparison with the prior art. The use of epitaxial graphene on silicon carbide makes possible, inter alia, designs without the risk of an excessive field increase at the edges.

Compared with previous transistors based on silicon carbide, the component proposed here makes reduced requirements of the quality of the silicon carbide crystals being used and, in conjunction with significantly simplified processing, at the same time has a high potential current-carrying capacity and dielectric strength. Further, it is possible to integrate a plurality of components on one chip without any problems. In comparison with the concepts employing pure graphene, a significantly higher and technologically more expedient on/off ratio can be obtained on account of the electrical and physical properties of epitaxial graphene.

In this case, epitaxial graphene is understood to mean the first graphene monolayer produced epitaxially on a surface of the silicon carbide. The interface between the epitaxial graphene and the silicon carbide is crucial for the physical and electrical properties of the component. In this case, the invention encompasses not only electrodes having a single monolayer of epitaxial graphene, but rather also encompasses electrodes comprising a plurality of monolayers of graphene one above another up to graphitic material. In particular, the layer conductivity of the electrodes is thereby improved. What is common to the electrodes according to the invention, however, is that the interface between the electrode and the silicon carbide is formed by a monolayer of epitaxial graphene.

By adapting the geometry and the doping ratios in the silicon carbide, and through the choice of the graphene/graphite layer thickness, it is possible to adapt the electrical properties of the semiconductor component specified to different component requirements within a wide range. A scaling from the nanometers range to the centimeters range of the channel length between the electrodes is thus possible, in principle. With regard to production, parallel processing on a wafer and possible production of integrated circuits are afforded. The processing can be conducted in a CMOS-compatible manner.

Since the graphene electrodes are embodied as ultraflat, an excessive edge field increase does not occur, and so, with regard to possible control or gate electrodes, flat gate stacks can be used in order to obtain the required electrical insulation of the gate electrode from the source or drain electrode. The production method is fundamentally non-critical with respect to alignment inaccuracies. The semiconductor component specified can potentially be produced without lithography.

The component specified is non-critical with respect to extensive crystal defects in the silicon carbide. In addition, it has been found that graphene forms a diffusion barrier that suppresses the penetration of defects into the semiconductor substrate.

The specified semiconductor component based on the epitaxial system of graphene on silicon carbide utilizes in combination as positive properties the low injection barrier between graphene and silicon carbide, the high current-carrying capacity of graphene and silicon carbide, the high breakdown field strength of silicon carbide, the high bulk charge carrier mobility of silicon carbide, the high charge carrier mobility of graphene and also the chemical, mechanical and thermal robustness of the material composite used.

Preferably, the separate electrodes are formed by a layer which comprises at least the one monolayer of epitaxial graphene and which is interrupted between the electrodes. In other words, the layer of epitaxial graphene is formed by thermal decomposition of the silicon carbide. This layer is subsequently interrupted in order to form the separate electrodes. This can be performed for example mechanically or electrochemically, in particular by plasma etching. The surface of the silicon carbide is exposed between the electrodes.

With regard to the configuration of an electronic switching element, in one preferred configuration, a source electrode and a drain electrode separate therefrom are applied as electrodes on the semiconductor substrate, and wherein an electrically insulated gate electrode is arranged between the source electrode and the drain electrode. As already explained, excessive field increases at the edges are avoided by virtue of the ultraflat graphene electrodes. In this respect, a comparatively low gate stack suffices for insulating the gate electrode from the source and/or drain electrode, such that the semiconductor component overall is kept flat. Expediently, for spacing apart the gate electrode, a dielectric is placed on the silicon carbide between source and drain electrodes. In this case, the gate electrode can consist, in particular, of a correspondingly suitable metal.

In an alternative configuration, the gate electrode is formed by an electrolyte. In this case, a dipping electrode performs the function of contact-making. An electrolytic medium acts as a gate capacitor. In particular, as an electrolytic medium an ionic liquid is applied on the semiconductor substrate. For electrical connection, in this case for example a metallic tip dips into the ionic liquid. If a voltage is applied, then this leads to the formation of a so-called Helmholtz or Stern double layer in the ionic liquid. The semiconductor substrate beneath the gate electrode sees a charge change.

In one preferred development of the semiconductor component, the semiconductor substrate has a vertical doping profile. In order to make the current channel through the semiconductor substrate controllable by the application of a gate voltage, it should run as near the surface as possible in the semiconductor substrate. An extension of the current channel into the bulk of the semiconductor substrate is avoided, however, by means of a vertical doping profile. For this purpose, by way of example, in a vertical direction, that is to say perpendicularly to the surface of the semiconductor substrate and to the graphene electrodes applied thereto, a junction or a sequence between n- and p-conducting regions can be produced by means of corresponding doping of the silicon carbide. By means of the depletion zone of charge carriers that occurs at such an n-p junction in the semiconductor substrate, the current channel can be delimited substantially to a horizontal direction. By applying a gate voltage to the region between the electrodes, control of the current channel is made possible by means of influencing the depletion zone or by charge carrier induction. A horizontal doping profile in the semiconductor substrate is not necessary for constructing the semiconductor component specified. In terms of process engineering, the production only of a vertical doping profile in the silicon carbide affords further engineering advantages in respect of costs. The conductivity of the current channel is controllable by the voltage at the gate electrode.

An n-doping of the silicon carbide is preferably effected by means of nitrogen or phosphorus. Aluminum, boron or gallium is preferably used for a p-doping of the silicon carbide.

Preferably, the silicon carbide is n-doped in a first region facing the electrodes and has a p-doping in a second region facing away from the electrodes. This takes account of the fact that epitaxial graphene in relation to n-doped silicon carbide has the lowest injection barrier of the system considered. The interface between epitaxial graphene and n-conducting silicon carbide has the lowest possible contact resistance. In this case, it has additionally been found that the injection of charge carriers can be further improved by means of a doping that is locally increased at the electrodes.

Expediently, the doping concentration and the vertical thickness of the first region adjacent to the electrodes are chosen in such a way that a depletion zone that forms at the n-p junction along the doping boundary extends if appropriate by application of an external electrical voltage into the first region as far as the surface of the semiconductor substrate. In this case, the doping of the first region is preferably chosen to be lower than the doping of the second region. Since the thickness of the space charge zone or depletion zone that forms at an n-p junction is in an inverse ratio to the concentration of the acceptors or donors or generally the doping concentration, as a result of this measure, the space charge zone, proceeding from the doping boundary, extends further in the direction toward the electrodes than away from the latter.

If the space charge zone extends are far as the surface of the semiconductor substrate or as far as the electrodes in the voltage-free state, then this results in a so-called "normal off" component. In the voltage-free state, the conductivity is minimized in the semiconductor substrate near the surface between the electrodes on account of the charge carrier depletion in the space charge zone. In other words, no significant current flows between the electrodes through the semiconductor substrate in the voltage-free state. The semiconductor component is turned off. If, on the other hand, a voltage of suitable polarity is applied via a gate electrode, then the extent of the space charge zone is forced back by means of this voltage. Beneath the gate electrode, charge carriers are induced in the semiconductor substrate. By means of these charge carriers, in the doped semiconductor substrate a conductive current channel is formed between the electrodes.

If, on the other hand, in the voltage-free state, the space charge zone, proceeding from the doping boundary or the n-p junction, does not extend as far as the graphene electrodes, then this results in a "normally on" component. This is because if no voltage is present, then a conductive current channel in the semiconductor substrate is formed through the n- or p-conducting region of the semiconductor substrate beneath the graphene electrodes. By the application of a voltage to a gate electrode between the graphene electrodes, charge carriers are displaced from the inherently conductive layer. The conductivity of the current channel between the electrodes is reduced. The semiconductor component turns off.

Expediently, the doping concentrations in the first region are between $10^{11}$ and $10^{20}$ atoms per $cm^3$ in the case of assigned vertical thicknesses of between 150 µm and 5 nm. In this case, the low doping concentration holds true for a relatively large thickness and the high doping concentration for a relatively small thickness. Depending on the desired dimensioning of the semiconductor component, it is possible to coordinate the doping concentration and the thickness of the first doped region adjacent to the electrodes with one another, such that the depth of the current channel is correspondingly configured. Particularly preferably, the doping concentrations in the first region are between $10^{13}$ and $10^{18}$ atoms per $cm^3$ in the case of assigned vertical thicknesses of between 15 µm and 10 nm.

In a further advantageous configuration of the semiconductor component, a back gate electrode is comprised, which is electrically conductively connected to the second region. The back gate electrode is arranged for example directly on the back side or laterally on the front side of the semiconductor substrate and electrically contact-connected to the second region. Particularly in the case of a vertical doping profile of the semiconductor substrate for example in accordance with a vertical n-p junction, the extent of the space charge zone or depletion zone at the n-p junction can be controlled by the application of a voltage to the back gate electrode. It is thus possible to provide a single semiconductor component which can be changed over between a "normally off" and a "normally on" state in operandi through the choice of a suitable back gate voltage. This affords interesting circuitry aspects which could not be realized heretofore with conventional semiconductor components.

In another, likewise advantageous configuration, a vertical doping profile is realized in the semiconductor substrate by virtue of the fact that the silicon carbide is n-doped in a first region adjacent to the electrodes. A semi-insulating silicon carbide is present in a second region facing away from the electrodes and following said first region. Since silicon carbide is n-conducting, in principle, owing to the presence of atmospheric nitrogen, a semi-insulating silicon carbide is produced for example by doping it with vanadium. The electrons as majority charge carriers present owing to the unavoidable n-doping by means of atmospheric nitrogen are trapped at an energetically lower energy level by a vanadium doping. As a result, said electrodes no longer contribute to the conductivity. The silicon carbide changes from an n-conducting state to a semi-insulating state.

In the construction of the semiconductor substrate composed of an n-conducting first region adjacent to the electrodes and a semi-insulating second region spaced apart therefrom, a conductive region limited in depth by the thickness of the first region remains beneath the electrodes. In the voltage-free state, this conductive region constitutes the current channel in the semiconductor substrate between the graphene electrodes. Consequently, this component is a so-called "normally on" component. Via the application of a voltage to a gate electrode between the graphene electrodes, the component turns off. In principle, a p-doping of the first region is also possible in this case.

In the configuration of the semiconductor component by means of a semi-insulating silicon carbide region, it has furthermore proved to be advantageous if the thickness of the first, n-conducting region of the silicon carbide has a vertical thickness of between 5 nm and 150 µm. With further preference, the thickness of the first region is between 10 nm and 1 µm.

It thus becomes clear that the semiconductor component specified on the basis of a graphene-silicon carbide combination can easily also be produced as a "normally off" component. Since silicon technology uses "normally off" transistors, the component described here thus affords a huge advantage over previous graphene components. Without "silicon circuits" being redesigned, silicon transistors could be replaced by EG-FET transistors (Epitaxial Graphene Field Effect Transistors).

In principle, it is possible to produce epitaxial graphene independently of the crystal orientation on a surface of the silicon carbide. At the present time, the quality of the layer of epitaxial graphene produced by heat treatment of the silicon carbide can be established the best in terms of process engineering if as hexagonal surface a (0001) surface of the silicon carbide crystal is used as an initial basis. 6H, 4H or 3C polytypes are preferably used in this case for the silicon carbide crystal. The 4H polytype has in the meantime become obtainable on an industrial scale. The 6H polytype of silicon carbide is likewise commercially available.

BRIEF DESCRIPTION OF THE DRAWINGS

Exemplary embodiments of the invention are explained in greater detail with reference to the drawing, in which:

FIG. 4A shows a transfer characteristic curve of the component shown in FIG. 3 in a logarithmic representation, and FIG. 4B shows the transfer characteristic curve of the component shown in FIG. 3 in a linear representation.

DETAILED DESCRIPTION

Figure 1A:
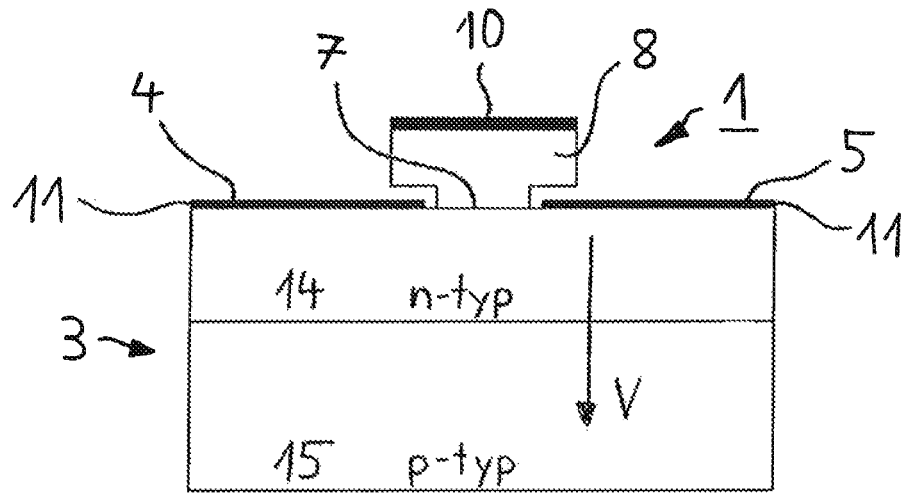
FIG. 1A schematically shows a cross section through a semiconductor component in accordance with a first embodiment variant.

FIG. 1A schematically illustrates a cross section of a semiconductor component 1 in accordance with a first embodiment variant. The semiconductor component 1 comprises a semiconductor substrate 3 composed of silicon carbide, to the surface of which a source electrode 4 and a drain electrode 5 separate therefrom are applied. In an exposed intermediate region 7 of the semiconductor substrate 3 between the source electrode 4 and the drain electrode 5, a gate stack is formed by a dielectric 8, on the top side of which a gate electrode 10 is arranged.

The source electrode 4 and the drain electrode 5 comprise at least one monolayer of epitaxial graphene 11 grown on a surface of the silicon carbide crystal. By way of example, the surface of the silicon carbide is a (0001) surface. The at least one monolayer of epitaxial graphene 11 is produced on the surface of the silicon carbide by thermal decomposition of the silicon carbide. The two electrodes 4, 5 are subsequently produced by interruption of the layer of epitaxial graphene 11 produced in the intermediate region 7.

In the vertical direction V, the semiconductor component 1 has a doping profile in such a way that the silicon carbide is n-conducting by doping by means of nitrogen in a first region 14 adjacent to the electrodes 4, 5. In a second region 15 facing away from the electrodes 4, 5, the silicon carbide is p-conducting by doping by means of aluminum.

The semiconductor substrate can be produced for example by epitaxial growth on a silicon carbide wafer with corresponding doping. The graphene layer 11 produced by thermal decomposition of the silicon carbide is interrupted for example by means of lithography and a subsequent treatment in an oxygen plasma.

The at least one monolayer of epitaxial graphene 11 of the electrodes 4, 5 has a low ohmic contact resistance with respect to the semiconductor substrate. The material combination of epitaxial graphene 11 on n-doped silicon carbide exhibits a low injection barrier.

The doping concentration in the second region 15 of the semiconductor region is approximately $10^{18}$ aluminum atoms per cm³. The vertical thickness of the second region is non-critical and is a few μm, for example. In the first region 14, the doping concentration of nitrogen atoms is approximately $10^{15}$ per cm³. The vertical thickness of the first region 14 is between 1.5 and 2 μm.

On account of the chosen doping concentrations and vertical thicknesses of the layers 14 and 15, in the voltage-free state of the semiconductor component 1 illustrated in FIG. 1A, the space charge zone or depletion zone that forms at the n-p junction extends into the first region 14 as far as the electrodes 4, 5. Consequently, in the voltage-free state, a region having a depletion of charge carriers is present in the region of the semiconductor substrate 3 beneath and between the electrodes 4, 5. The semiconductor component 1 is a "normally off" type, wherein no current flows between source and drain electrodes in a voltage-free state. The component 1 is turned off.

Figure 1B:
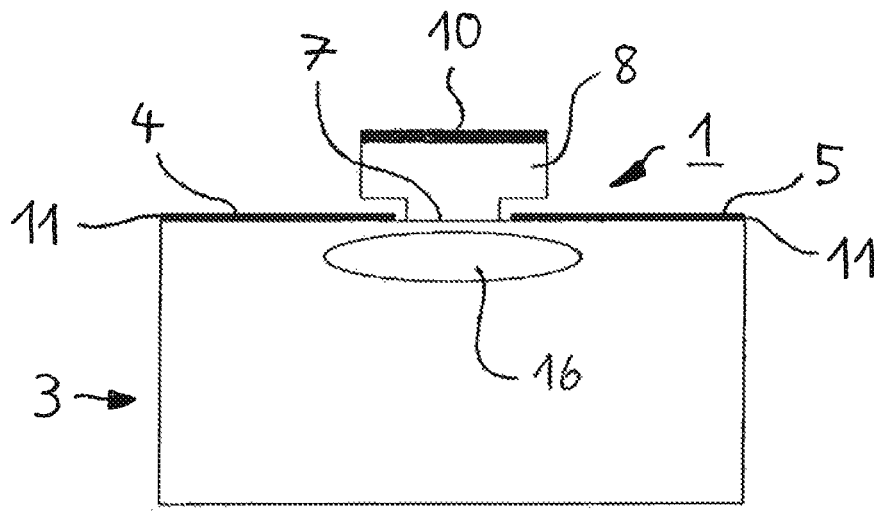
FIG. 1B shows the on state of the semiconductor component in accordance with FIG. 1A in a cross-sectional illustration.

The semiconductor component 1 in accordance with FIG. 1A is illustrated once again in the same cross section in FIG. 1B. In this case, however, a positive voltage is present at the gate electrode 10. Via the dielectric 8, charge carrier induction takes place in the semiconductor substrate 3 beneath the intermediate region 7. A conductive region 16 having induced charge carriers arises. This region 16 forms a current channel between the source electrode 4 and the drain electrode 5. The semiconductor component 1 is turned on. A current flows between source electrode 4 and drain electrode 5 via a current channel within the semiconductor substrate 3.

Figure 2A:
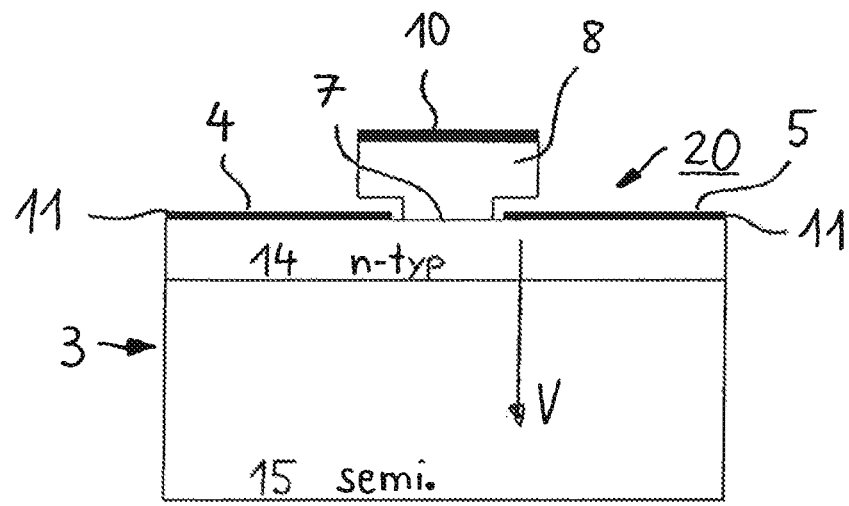
FIG. 2A shows a semiconductor component in accordance with a second embodiment variant in a cross section.

FIG. 2A illustrates a semiconductor component 20 in accordance with a second embodiment variant in a cross section. In this case, identical reference signs designate identical parts.

In a manner corresponding to FIG. 1A, the semiconductor component 20 in accordance with FIG. 2A also comprises a semiconductor substrate 3 composed of silicon carbide, to the surface of which a source electrode 4 and a drain electrode 5 are applied, which comprise at least one monolayer of epitaxial graphene 11 on the silicon carbide surface. The electrodes 4, 5 of the semiconductor component 20 according to FIG. 2A are likewise produced by means of thermal decomposition of the surface of the silicon carbide.

A gate stack comprising a dielectric 8 and a gate electrode 10 applied thereto is once again arranged in an intermediate region 7 between the source electrode 4 and the drain electrode 5.

Like FIG. 1A, the semiconductor substrate 3 of the semiconductor component 20 according to FIG. 2A exhibits a vertical doping profile. In a first region 14 adjacent to the electrodes 4, 5, the silicon carbide is n-conducting by doping. In the adjacent second region 15, the silicon carbide has semi-insulating properties, however, by a compensation doping. Phosphorus is chosen for the doping of the n-conducting first region 14. The compensation doping of the second region 15 is effected by ion implantation of vanadium, for example. In the first region 14, the doping concentration is chosen to be approximately $5 \times 10^{17}$ impurity atoms/cm³. The vertical thickness of the first region 14 is approximately 100 nm.

In the voltage-free state, as a result of the thickness of the n-conducting first region 14, there is a depth-limited current channel in the semiconductor substrate 3, which channel provides an electrically conductive connection between the source electrode 4 and the drain electrode 5. The semiconductor component 20 according to FIG. 2A is therefore a component of the "normally on" type.

Figure 2B:
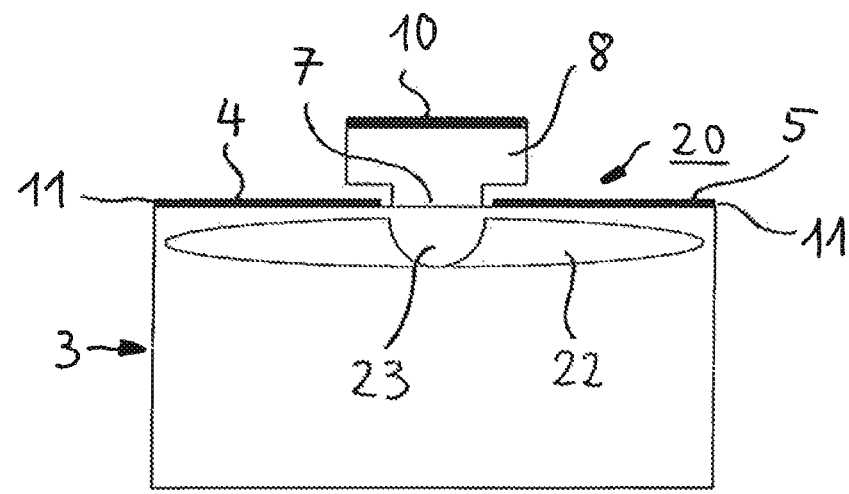
FIG. 2B shows the off state of the semiconductor component in accordance with FIG. 2A in a cross section, FIG. 3 schematically shows a semiconductor component in accordance with a third embodiment variant in a cross section and in a plan view.

The semiconductor component 20 in accordance with FIG. 2A is illustrated once again in a cross section in FIG. 2B. However, the state of the semiconductor component 20 is now shown wherein a negative voltage is applied to the gate electrode 10. Via the dielectric 8, a charge reversal takes place in the intermediate region 7, such that a region 23 of displaced charge carriers arises in the conductive layer 22 inherently provided by the n-doping. The conductivity of the current channel in the semiconductor substrate 3 between the source electrode 4 and the drain electrode 5 is reduced. The semiconductor component 20 is turned off when a gate voltage is present.

Figure 3:
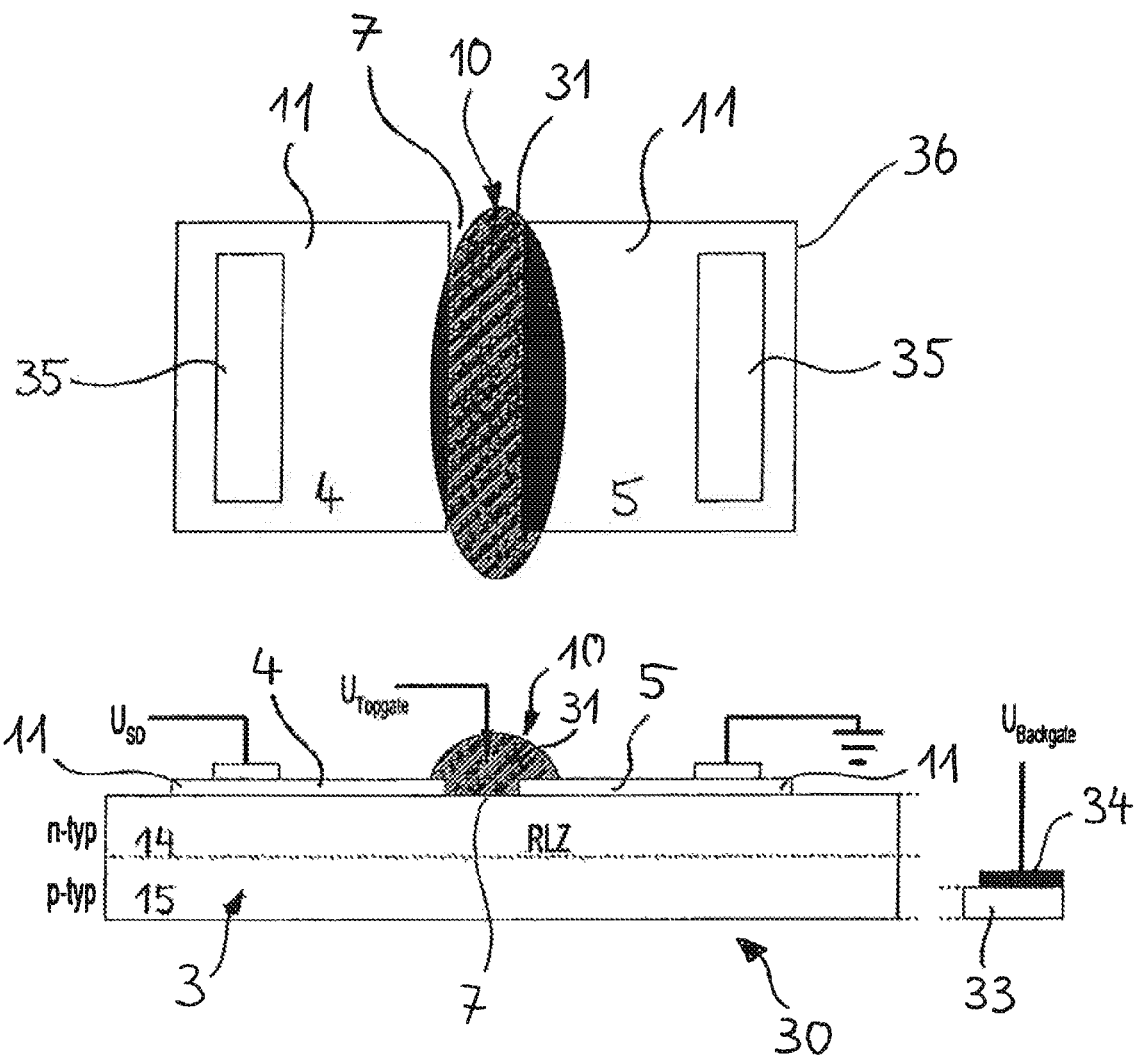

FIG. 3 illustrates a semiconductor component 30 in accordance with a third embodiment variant in a plan view and in a cross section. In this case, identical parts are once again provided with identical reference signs.

In the case of the semiconductor component 30 in accordance with FIG. 3, the semiconductor substrate 3 likewise has a vertical n-p junction beneath the electrodes 4, 5. A space charge zone SCZ arises which extends far into the first, n-conducting region 14 of the silicon carbide. The doping concentrations and the vertical thicknesses of the regions 14, 15 can vary relative to the semiconductor component 1 illustrated in FIG. 1.

In contrast to the semiconductor component 1 illustrated in FIG. 1, no dielectric 8 is applied in the intermediate region 7 between the source electrode 4 and the drain electrode 5. Rather, an electrochemical electrode is used as a gate electrode 10. For this purpose, a drop of an ionic liquid 31 is applied between the two electrodes 4, 5, a tip dipping into said drop for the purpose of electrical contact-making.

Furthermore, a back gate electrode 34 is applied on the back side 33 of the p-conducting second region 15 of the semiconductor substrate 3.

Electrical contacts 35 composed of titanium and gold are applied for the purpose of making contact with the electrodes 4, 5 comprising at least one monolayer of epitaxial graphene 11 on silicon carbide. Other suitable metals can also be used for the contacts.

The electrodes 4, 5 are produced from a single graphene layer 36 that arises as a result of thermal decomposition of the silicon carbide. For this purpose, the layer 36 was mechanically interrupted in the intermediate region 7.

The terminal voltages are designated in the cross-sectional illustration in accordance with FIG. 3. In this case, the drain electrode 5 is contact-connected to ground. The source-drain voltage USD is present at the source electrode 4. The gate voltage $U_{Topgate}$ is applied to the gate electrode 10. The voltage present at the back gate electrode 34 is designated by $U_{Backgate}$.

The semiconductor component 30 illustrated in FIG. 3, has the major advantage that it can be changed over in operandi between a "normally on" mode and a "normally off" mode. For this purpose, it is merely necessary to correspondingly vary the voltage $U_{Backgate}$ at the back gate electrode 34. If a corresponding voltage $U_{Backgate}$ is chosen such that the space charge zone SCZ extends as far as the electrodes 4, 5, then the semiconductor component 30 is in a "normally off" state. If the space charge zone SCZ is reduced in its vertical extent by the voltage $U_{Backgate}$ being changed, then the semiconductor component 30 changes to a "normally on" state.

FIG. 4A and FIG. 4B illustrate the switching behavior of the semiconductor component 30 in accordance with FIG. 3.

The corresponding transfer characteristic curve of the dependence of the current $I_{SD}$ between the source electrode 4 and the drain electrode 5 on the gate voltage $U_{Topgate}$ is represented logarithmically in FIG. 4A and linearly in FIG. 4B. In this case, the transfer characteristic curve is recorded for a back gate voltage $U_{Backgate}$=−11 V, that is to say for a "normally off" mode of the component 30 shown in FIG. 3. The threshold voltage is 1.3 V. The source-drain current ISD rises linearly up to a gate voltage $U_{Topgate}$ of 2 V on account of the induced charge. This upper limit is given by the electrochemical stability window of the ionic liquid and would be avoided in the case of a dielectric gate stack. The on/off ratio of the currents in the on and off states is approximately $10^4$ in the available voltage window.

The construction shown in FIG. 3 is realistic for small source-drain voltages. With the choice of a dielectric for taking up the gate electrode 10 and correspondingly varied geometric parameters, a high dielectric strength of up to approximately 1 kV should be expected.

The invention claimed is:

1. A semiconductor component having a semiconductor substrate comprising at least one of a crystalline silicon carbide and a multicrystalline silicon carbide and having separate electrodes applied thereto, said electrodes each comprising at least one monolayer of epitaxial graphene on silicon carbide, in such a way that a current channel is formed between the electrodes through the semiconductor substrate.

2. The semiconductor component as claimed in claim 1, wherein the separate electrodes are formed by a layer which comprises at least the one monolayer of epitaxial graphene and which is interrupted between the electrodes.

3. The semiconductor component as claimed in claim 1, wherein a source electrode and a drain electrode separate therefrom are applied as electrodes on the semiconductor substrate, and wherein an electrically insulated gate electrode is arranged between the source electrode and the drain electrode.

4. The semiconductor component as claimed in claim 3, wherein the gate electrode is arranged on the semiconductor substrate with the interposition of a dielectric.

5. The semiconductor component as claimed in claim 3, wherein a source electrode and a drain electrode separate therefrom are applied as electrodes on the semiconductor substrate, and wherein an ionic liquid on the semiconductor substrate is applied as the gate electrode between the source electrode and the drain electrode.

6. The semiconductor component as claimed in claim 1, wherein the semiconductor substrate has a vertical doping profile.

7. The semiconductor component as claimed in claim 6, wherein the semiconductor substrate comprises a doping boundary between a first region facing the electrodes and a second region facing away from the electrodes, said doping boundary running substantially parallel to the electrodes, and wherein the silicon carbide in the first region has a different doping than the second region.

8. The semiconductor component as claimed in claim 7, wherein the silicon carbide is n-doped in the first region of the semiconductor substrate and p-doped in the second region of the semiconductor substrate.

9. The semiconductor component as claimed in claim 8, wherein the doping concentration and the vertical thickness of the first region are chosen in such a way that a depletion zone that forms at the n-p junction along the doping boundary extends if appropriate by means of an external electrical voltage into the first region as far as the surface of the semiconductor substrate.

10. The semiconductor component as claimed in claim 8, wherein the doping concentration is chosen to be smaller in the first region than in the second region.

11. The semiconductor component as claimed in claim 7, wherein a back gate electrode is additionally comprised, which is electrically conductively connected to the second region.

12. The semiconductor component as claimed in claim 7, wherein the silicon carbide is n-doped in the first region of the semiconductor substrate and semi-insulating in the second region of the semiconductor substrate.

13. The semiconductor component as claimed in claim 12, wherein the semi-insulating silicon carbide is doped with vanadium.

14. The semiconductor component as claimed in claim 12, wherein the first region has a vertical thickness of between 5 nm and 150 µm.

15. The semiconductor component as claimed in claim 1, wherein the silicon carbide is a single crystal, and wherein the epitaxial graphene of the electrodes is applied on the (0001) surface of the silicon carbide single crystal.

16. The semiconductor component as claimed in claim 1, wherein:
- the separate electrodes comprise a source electrode and a drain electrode; and
- the at least one monolayer of epitaxial graphene of the source electrode is separate from the at least one monolayer of epitaxial graphene of the drain electrode.

17. A semiconductor component comprising:
- a semiconducting silicon carbide substrate;
- a graphene source electrode comprising at least one monolayer of epitaxial graphene directly contacting the semiconducting silicon carbide substrate;
- a graphene drain electrode comprising at least one monolayer of epitaxial graphene directly contacting the semiconducting silicon carbide substrate, wherein the at least one monolayer of epitaxial graphene of the graphene drain electrode is separated from the at least one monolayer of epitaxial graphene of the graphene source electrode by an intermediate region of the semiconducting silicon carbide substrate; and
- a gate electrode formed on the intermediate region of the semiconducting silicon carbide substrate, such that a current channel is formable through the semiconductor substrate between the source and drain electrodes based on a voltage level applied to the gate electrode.

* * * * *